United States Patent
Huang et al.

(10) Patent No.: US 8,309,854 B2
(45) Date of Patent: Nov. 13, 2012

(54) RIGID-FLEX PRINTED CIRCUIT BOARD MODULE HAVING A WORKING ZONE CONNECTED TO A NON-WORKING ZONE

(75) Inventors: Chien-Yi Huang, Taipei Hsien (TW); Chen-Liang Ku, Taipei Hsien (TW); Ko-Chin Lee, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 417 days.

(21) Appl. No.: 12/578,045

(22) Filed: Oct. 13, 2009

(65) Prior Publication Data

US 2010/0230140 A1 Sep. 16, 2010

(30) Foreign Application Priority Data

Mar. 16, 2009 (TW) .............................. 98108431 A

(51) Int. Cl.
*H05K 1/00* (2006.01)
*H05K 3/00* (2006.01)

(52) U.S. Cl. ........... 174/254; 174/250; 361/749; 29/830
(58) Field of Classification Search .................. 174/254, 174/250; 361/749–751; 29/830; 156/250, 156/256

See application file for complete search history.

(56) References Cited

U.S. PATENT DOCUMENTS

| | | | | |
|---|---|---|---|---|
| 5,262,594 A * | 11/1993 | Edwin et al. | ................... | 174/254 |
| 6,288,343 B1 * | 9/2001 | Ahn et al. | ...................... | 174/254 |
| 7,378,596 B2 * | 5/2008 | Kawaguchi et al. | .......... | 174/255 |
| 7,690,104 B2 * | 4/2010 | Rosenblatt et al. | ............. | 29/830 |
| 7,789,989 B2 * | 9/2010 | Ren et al. | ....................... | 156/256 |
| 8,042,445 B2 * | 10/2011 | Lin et al. | ......................... | 83/879 |
| 2008/0047135 A1 * | 2/2008 | Arnold | ............................ | 29/829 |

FOREIGN PATENT DOCUMENTS

TW 200939916 9/2009

* cited by examiner

*Primary Examiner* — Angel R Estrada
*Assistant Examiner* — Dimary Lopez
(74) *Attorney, Agent, or Firm* — Foley & Lardner LLP

(57) ABSTRACT

A rigid-flex printed circuit board module includes a non-working zone and a working zone. The non-working zone defines a receiving space. The working zone is disposed in the receiving space, and is connected to the non-working zone through a plurality of interconnecting zones. The interconnecting zones are flexible regions having greater flexibility than the non-working zone, and are of the same thickness and material. The interconnecting zones are defined by flexible circuit board member such that the interconnecting zones can be quickly cut off using a single machine during processing of the rigid-flex printed circuit board module. Thus, the speed of separating the working zone from the non-working zone can be increased, and costs and time associated with processing and manufacturing can be reduced. Additionally, the processing flow can be simplified, and the product quality of the working zone after cutting can be ensured.

18 Claims, 12 Drawing Sheets

```
┌─────────────────────────────────────────────────┐
│ Cutting two rigid circuit board panels respectively │
│ into rigid circuit board members such that each of │
│ the rigid circuit board members has a first frame │
│ body and at least two first board bodies each of │
│ which is connected to the first frame body through │
│ a plurality of connecting portions, and cutting a │──91
│ flexible circuit board panel into a flexible circuit │
│ board member such that the flexible circuit board │
│ member has a second frame body and at least two │
│ second board bodies each of which is connected to │
│ the second frame body through a plurality of │
│ interconnecting zones │
└─────────────────────────────────────────────────┘
                         │
                         ▼
┌─────────────────────────────────────────────────┐
│ Stacking and bonding the rigid circuit board members │
│ and the flexible circuit board member such that the │
│ first frame bodies are overlapped with and are │
│ bonded to the second frame body, the first board │
│ bodies are overlapped with and are bonded to the │──92
│ second board bodies, the connecting portions are │
│ not overlapped with the second board bodies, and at │
│ least a part of the interconnecting zones is not │
│ overlapped with any of the connecting portions │
│ and the first board bodies │
└─────────────────────────────────────────────────┘
                         │
                         ▼
┌─────────────────────────────────────────────────┐
│ Cutting off the connecting portions interconnecting │
│ each of the first board bodies and the respective │──93
│ first frame body so as to separate each of the first │
│ board bodies from the respective first frame body │
└─────────────────────────────────────────────────┘
```

FIG. 5

| Disposing electronic components in each working zone | 94 |

| Cutting off the interconnecting zones between each working zone and the non-working zone so as to separate the working zones from the non-working zone | 95 |

| Cutting two rigid circuit board panels respectively into rigid circuit board members such that each of the rigid circuit board members has a first frame body and a first board body which is connected to the first frame body through a plurality of connecting portions, and cutting a flexible circuit board panel into a flexible circuit board member such that the flexible circuit board member has a second frame and a second board body connected to the second frame body through a plurality of interconnecting zones | —91' |

↓

| Stacking and bonding the rigid circuit board members and the flexible circuit board member such that the first frame bodies are overlapped with and are bonded to the second frame body, the first board bodies are overlapped with and are bonded to the second board body, the connecting portions are not overlapped with the second board body, and at least a part of the interconnecting zones is not overlapped with any of the connecting portions and the first board bodies | —92' |

↓

| Cutting off the connecting portions so as to separate the first board bodies from the respective first frame bodies | —93' |

FIG. 14

RIGID-FLEX PRINTED CIRCUIT BOARD MODULE HAVING A WORKING ZONE CONNECTED TO A NON-WORKING ZONE

CROSS-REFERENCE TO RELATED APPLICATION

This application claims priority of Taiwanese Application No. 098108431, filed on Mar. 16, 2009.

BACKGROUND OF THE INVENTION

1. Field of the Invention

The invention relates to a rigid-flex printed circuit board module, and a manufacturing method and a processing method therefor, more particularly to a rigid-flex printed circuit board module that has a working zone connected to a non-working zone thereof through flexible interconnecting zones, and to a manufacturing method and a processing method therefor.

2. Description of the Related Art

A rigid-flex printed circuit board (rigid-flex PCB, or so-called rigid-flex bonded board) is an electronic component comprising a rigid circuit board member and a flexible circuit board member that are assembled into a single circuit board. Due to the flexibility characteristic of the rigid-flex printed circuit board, the rigid-flex printed circuit board can be designed to have a required mode or shape to match the structure of a product incorporating the same. Apart from allowing a reasonable degree of freedom in design, the rigid-flex printed circuit board can effectively minimize the volume of the product incorporating the same and permit a reduction in the weight of the product. Therefore, rigid-flex printed circuit boards are now widely used in electronic products, such as mobile phones, personal digital assistants, digital cameras, digital camcorders, etc.

SUMMARY OF THE INVENTION

An object of the present invention is to provide a rigid-flex printed circuit board module which has a working zone connected to a non-working zone through a plurality of flexible interconnecting zones to permit quick separation of the working zone and the non-working zone and a reduction in manufacturing and processing costs and time.

Another object of this invention is to provide a method for manufacturing a rigid-flex printed circuit board module, which can increase the manufacturing speed.

Still another object of this invention is to provide a method for processing the rigid-flex printed circuit board module, which can increase the processing speed.

The objects of this invention and solutions to the technical problems associated with the prior art are realized using the following technical means. The rigid-flex printed circuit board module according to the present invention includes a non-working zone and a working zone. The non-working zone defines a receiving space. The working zone is disposed in the receiving space. The working zone is connected to the non-working zone only through a plurality of interconnecting zones. Each of the interconnecting zones is a flexible region that has greater flexibility than the non-working zone.

In the aforementioned rigid-flex printed circuit board module, the interconnecting zones are of the same thickness and material. The rigid-flex printed circuit board module includes a flexible circuit board member defining the interconnecting zones.

The aforementioned rigid-flex printed circuit board module includes a rigid circuit board member and a flexible circuit board member. The rigid circuit board member includes a first board body. The flexible circuit board member includes a second board body. The first and second board bodies are bonded to each other in a stack and cooperatively define the working zone. The rigid circuit board member further includes a first frame body surrounding the first board body and separated from the first board body. The flexible circuit board member further includes a second frame body surrounding the second board body. The first and second frame bodies are bonded to each other in a stack and cooperatively define the non-working zone. The flexible circuit board member defines the interconnecting zones that interconnect the second board body and the second frame body.

The method for manufacturing the aforementioned rigid-flex printed circuit board module includes the following steps:

(A) cutting a rigid circuit board panel into a rigid circuit board member such that the rigid circuit board member has a first frame body and a first board body connected to the first frame body through a plurality of connecting portions, and cutting a flexible circuit board panel into a flexible circuit board member such that the flexible circuit board member has a second frame body and a second board body connected to the second frame body through a plurality of interconnecting zones;

(B) bonding the rigid circuit board member and the flexible circuit board member together such that the first frame body and the second frame body are bonded to each other in a stack, and the first board body and the second board body are bonded to each other in a stack, the connecting portions being not overlapped with the second board body, at least a part of the interconnecting zones being not overlapped with the connecting portions and the first board body; and (C) cutting off the connecting portions so as to separate the first board body from the first frame body.

In the aforementioned method for manufacturing a rigid-flex printed circuit board module, in step (A), the rigid circuit board member further has a plurality of cutout portions corresponding respectively to the interconnecting zones in position. In step (B), the interconnecting zones correspond respectively to the cutout portions in position and are not overlapped with the connecting portions and the first frame body.

The method for processing the aforementioned rigid-flex printed circuit board module includes the following steps:

(A) disposing an electronic component in the working zone; and (B) cutting off the interconnecting zones between the working zone and the non-working zone so as to separate the working zone from the non-working zone.

The rigid-flex printed circuit board module of the present invention includes a non-working zone and two working zones. The non-working zone defines two receiving spaces that are adjacent to each other. Each of the working zones is disposed in a respective one of the receiving spaces and is connected to the non-working zone only through a plurality of interconnecting zones. Each of the interconnecting zones is a flexible region having greater flexibility than the non-working zone. Certainly, the working zones may be designed to be more than two in number.

The aforementioned rigid-flex printed circuit board module includes a rigid circuit board member and a flexible circuit board member. The rigid circuit board member includes a first frame body. The flexible circuit board member includes a second frame body. The first and second frame bodies are bonded together in a stack and cooperatively define the non-working zone.

In the aforementioned rigid-flex printed circuit board module, the rigid circuit board member includes two first board bodies. The first frame body surrounds and is separated from each of the first board bodies. The flexible circuit board member includes two second board bodies. The second frame body surrounds each of the second board bodies. Each of the first board bodies and a respective one of the second board bodies are bonded together in a stack and cooperatively define a respective one of the working zones. The flexible circuit board member defines the interconnecting zones, which interconnect the second board bodies and the second frame body.

The method for manufacturing the aforementioned rigid-flex printed circuit board module includes the following steps:

(A) cutting a rigid circuit board panel into a rigid circuit board member such that the rigid circuit board member has a first frame body and at least two first board bodies each of which is connected to the first frame body through a plurality of connecting portions, and cutting a flexible circuit board panel into a flexible circuit board member such that the flexible circuit board member has a second frame body and at least two second board bodies each of which is connected to the second frame body through a plurality of interconnecting zones;

(B) bonding the rigid circuit board member and the flexible circuit board member together such that the first frame body and the second frame body are bonded to each other in a stack, and each of the first board bodies is bonded to a corresponding one of the second board bodies in a stack, the connecting portions being not overlapped with the second board bodies, at least a part of the interconnecting zones being not overlapped with the connecting portions and the first board bodies; and (C) cutting off the connecting portions connecting each of the first board bodies to the first frame body so as to separate the first board bodies from the first frame body.

In the method for manufacturing the aforementioned rigid-flex printed circuit board module, in step (A), the rigid circuit board member further has a plurality of cutout portions corresponding respectively to the interconnecting zones in position. In step (B), the interconnecting zones correspond respectively to the cutout portions in position and are not overlapped with the connecting portions and the first frame body.

The method for processing the aforementioned rigid-flex printed circuit board module includes:

(A) disposing an electronic component in each of the working zones; and (B) cutting off the interconnecting zones between each of the working zones and the non-working zone so as to separate each of the working zones from the non-working zone.

In the rigid-flex printed circuit board module according to the present invention, since the working zone(s) and the non-working zone are interconnected through the flexible interconnecting zones, when cutting off the interconnecting zones of the rigid-flex printed circuit board module, the interconnecting zones can be quickly cut off using a single machine. Thus, the speed of separating the working zone(s) from the non-working zone is effectively increased to thereby reduce the costs and time associated with the manufacture and processing of the rigid-flex printed circuit board module. In addition, the processing flow can be simplified, and the product quality of the working zone (s) after cutting can be ensured.

BRIEF DESCRIPTION OF THE DRAWINGS

Other features and advantages of the present invention will become apparent in the following detailed description of the preferred embodiments with reference to the accompanying drawings, of which:

FIG. 5 is a flowchart to illustrate a method for manufacturing the first preferred embodiment of a rigid-flex printed circuit board module according to the present invention;

FIG. 14 is a flowchart to illustrate a method for manufacturing the second preferred embodiment of a rigid-flex printed circuit board module according to the present invention;

DETAILED DESCRIPTION OF THE PREFERRED EMBODIMENTS

Figure 1:
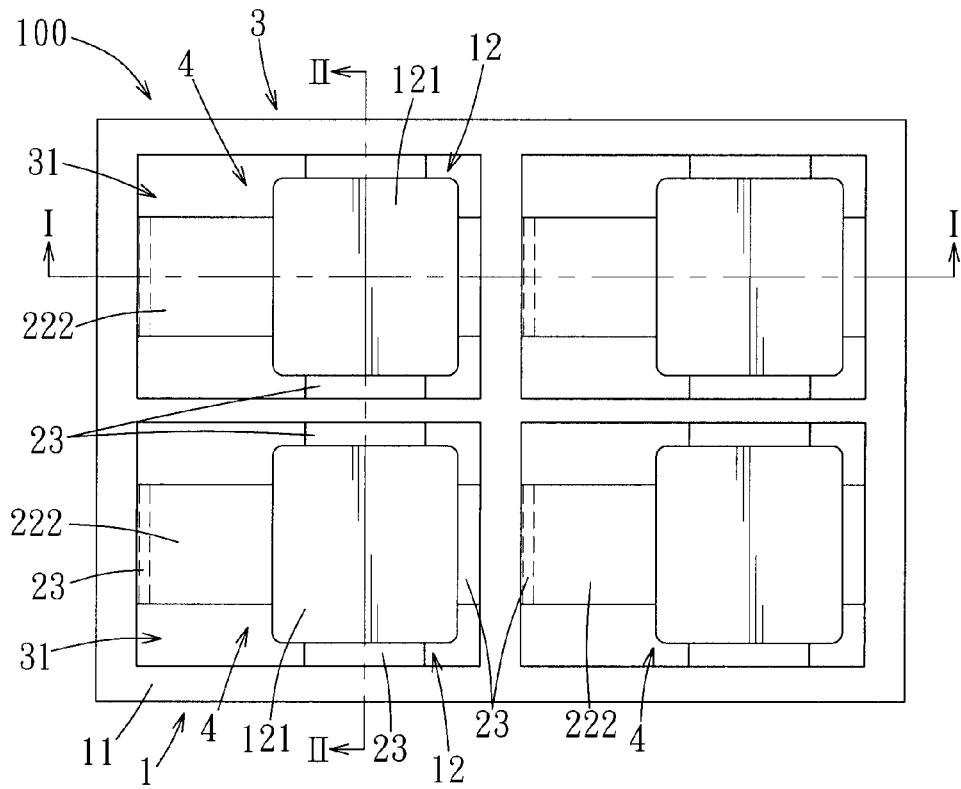
FIG. 1 is a top view of the first preferred embodiment of a rigid-flex printed circuit board module according to the present invention, illustrating working zones connected to a non-working zone through interconnecting zones.

Through a description of the preferred embodiments, the technical means employed by the present invention to achieve the intended objects, and the advantageous effects contem- plated thereby, can be better understood and appreciated. It is noted that the accompanying drawings are for illustration and reference only, and are not intended to limit the scope of the present invention.

Before the present invention is described in greater detail with reference to the accompanying preferred embodiments, it should be noted herein that like elements are denoted by the same reference numerals throughout the disclosure.

Figure 2:
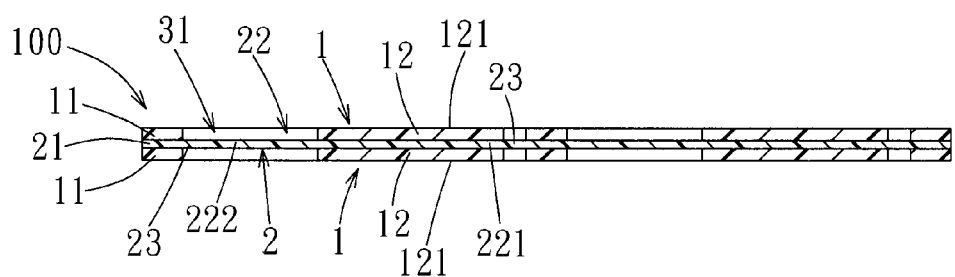
FIG. 2 is a sectional view of the first preferred embodiment taken along line I-I of FIG. 1.
Figure 3:
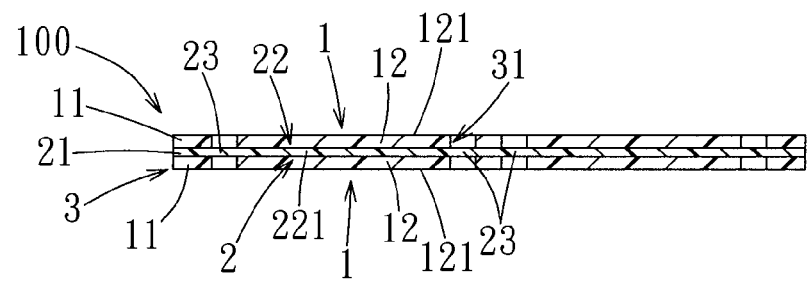
FIG. 3 is a sectional view of the first preferred embodiment taken along line II-II of FIG. 1.
Figure 4:
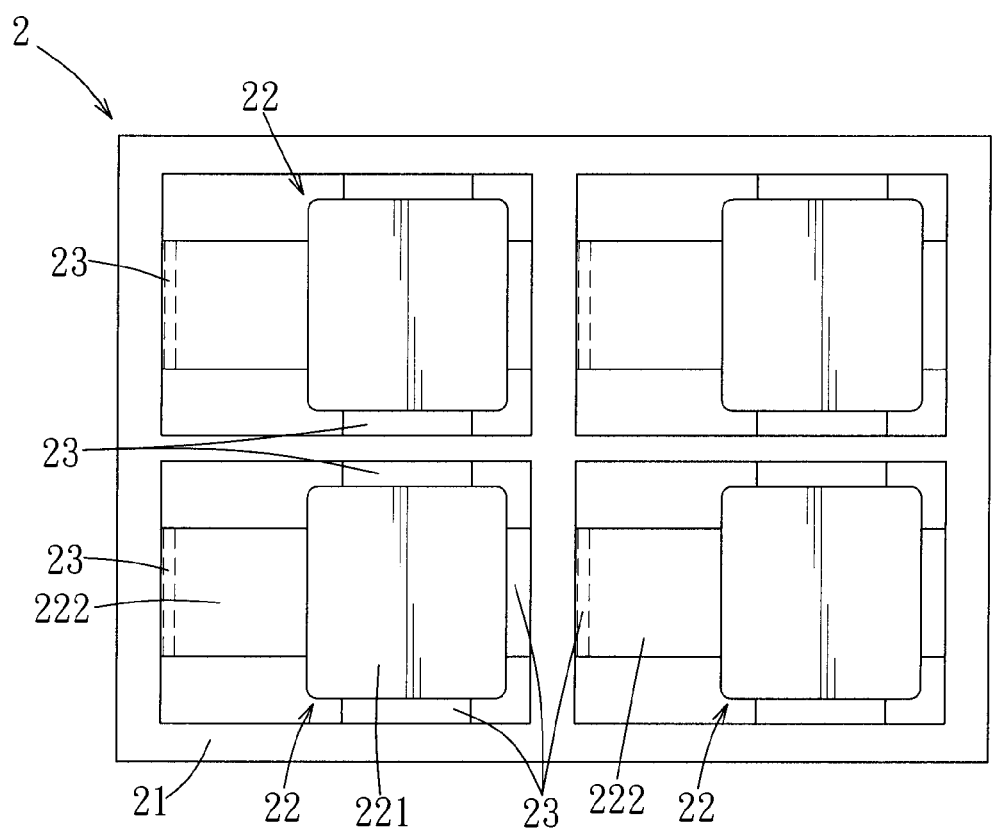
FIG. 4 is a top view of a flexible circuit board member of the first preferred embodiment of a rigid-flex printed circuit board module according to the present invention, illustrating second board bodies connected to a second frame body through the interconnecting zones.

Referring to FIGS. 1 and 2, the first preferred embodiment of a rigid-flex printed circuit board module 100 according to the present invention is shown to include a plurality of rigid circuit board members 1, and a flexible circuit board member 2 bonded to the rigid circuit board members 1 in a stack. In this embodiment, the number of the rigid circuit board mem- bers 1 is two.

As shown in FIGS. 1, 2, 3, and 4, each of the rigid circuit board members 1 includes a first frame body 11 and a plural- ity of first board bodies 12. In this embodiment, the first frame body 11 is shaped like a rectangular grid. The first frame body 11 surrounds each of the first board bodies 12 and is separated from the first board bodies 12. The flexible circuit board member 2 includes a second frame body 21 and a plurality of second board bodies 22. The second frame body 21 has a shape corresponding to that of the first frame body 11, and surrounds each of the second board bodies 22. The second frame body 21 is interposed between and is bonded to the first frame bodies 11 of the two rigid circuit board members 1 in a stack, and cooperates with the rigid circuit board members 1 to define a non-working zone 3. The non-working zone 3 defines a plurality of receiving spaces 31 that are adjacent to each other. Each of the second board bodies 22 is interposed between and is bonded to the respective ones of the first board bodies 12 of the two rigid circuit board members 1 in a stack, and cooperates therewith to define a working zone 4 that is disposed in a respective one of the receiving spaces 31. Each of the second board bodies 22 has a contact portion 221 with a shape corresponding to that of the respective ones of the first board bodies 12 and being bonded thereto in a stack, and an extension portion 222 connected to one side of the contact portion 221 and exposed from the respective ones of the first board bodies 12. Wiring (not shown) is provided to permit electrical conduction between the contact portion 221 and the respective ones of the first board bodies 12 in each stack. Each of the first board bodies 12 has a surface 121 not contacting the contact portion 221 and having a certain area provided with a copper foil (not shown) for mounting an electronic component (not shown). The extension portion 222 of each of the second board bodies 22 is used for transmission of elec- trical signals or power. Each of the second board bodies 22 is connected to the second frame body 21 through a plurality of interconnecting zones 23 that are disposed on the contact portion 221 and the extension portion 222 thereof. Thus, the working zone 4 cooperatively defined by one of the second board bodies 22 and two corresponding ones of the first board bodies 12 that are bonded thereto in a stack can be positioned in the respective one of the receiving spaces 31. Since the interconnecting zones 23 are defined by the flexible circuit board member 2, the interconnecting zones 23 are of the same thickness and the same material, and are flexible regions having greater flexibility than the first frame bodies 11 in the non-working zone 3.

It should be noted that, in this embodiment, the receiving spaces 31 defined by the non-working zone 3, and the work- ing zones 4 cooperatively defined by the first board bodies 12 and the second board bodies 22 are exemplified to be four in number. However, in practice, the numbers of the receiving spaces 31 and the working zones 4 can be varied depending on actual requirements. In addition, the working zone 4 can be cooperatively defined by two or more second board bodies 22, and two or more first board bodies 12 that are separated from each other and that are respectively bonded to top sides or bottom sides of the contact portions 221 of the second board bodies 22, and is not restricted to this embodiment in which two first board bodies 12 are respectively bonded to top and bottom sides of the contact portion 221 of one second board body 22 in a stack to define the working zone 4. Moreover, the shapes of the receiving spaces 31 in the non-working zone 3, and the shapes of the first and second board bodies 12, 22 are not limited to what are disclosed herein, and may be altered depending on actual design requirements.

A method for manufacturing the rigid-flex printed circuit board module 100 according to the present invention will be described in detail below with reference to FIGS. 4, 5, 6, and 7, in which FIG. 5 is a flowchart of the manufacturing method. The manufacturing method comprises the following steps.

In step 91, two rigid circuit board panels 10 are respectively cut into two rigid circuit board members 1' such that each of the rigid circuit board members 1' has a first frame body 11 and a plurality of first board bodies 12 each of which is connected to the first frame body 11 through a plurality of connecting portions 13, and a flexible circuit board panel 20 is cut into a flexible circuit board member 2 such that the flexible circuit board member 2 has a second frame body 21 and a plurality of second board bodies 22 each of which is connected to the second frame body 21 through a plurality of interconnecting zones 23. In this embodiment, the first board bodies 12 of each of the rigid circuit board members 1 are connected to the respective first frame body 11 through four connecting portions 13 that are respectively connected to four corners of the respective first frame body 11, and each of the second board bodies 22 of the flexible circuit board member 2 is connected to the second frame body 21 through four interconnecting zones 23 that are disposed on a contact por- tion 221 and an extension portion 222 of the respective second board body 22.

Figure 6:
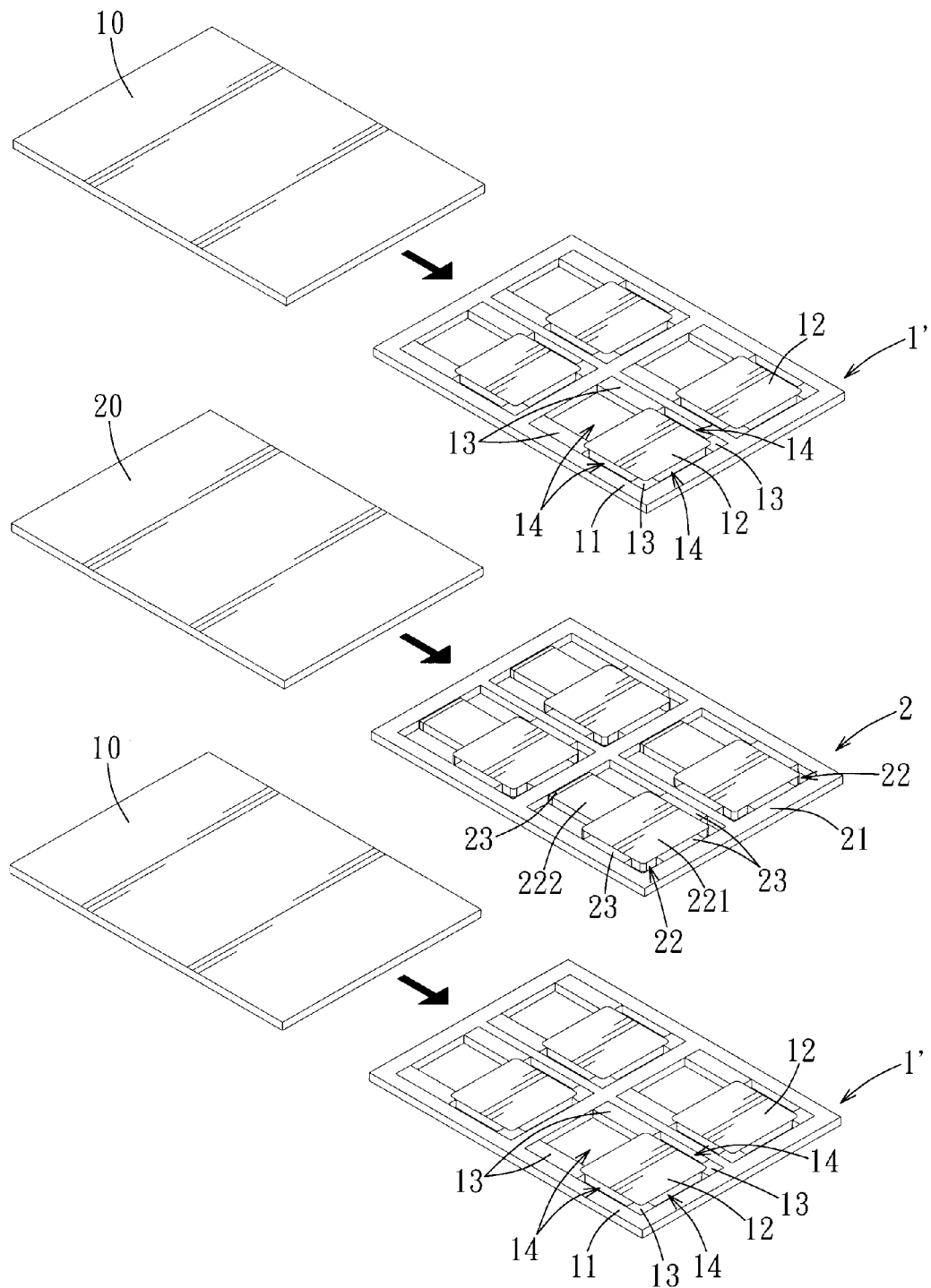
FIG. 6 is a schematic view to illustrate the manufacture of the first preferred embodiment of a rigid-flex printed circuit board module according to the present invention, showing the shapes of two rigid circuit board members and a flexible circuit board member respectively cut from rigid and flexible circuit board panels.
Figure 7:
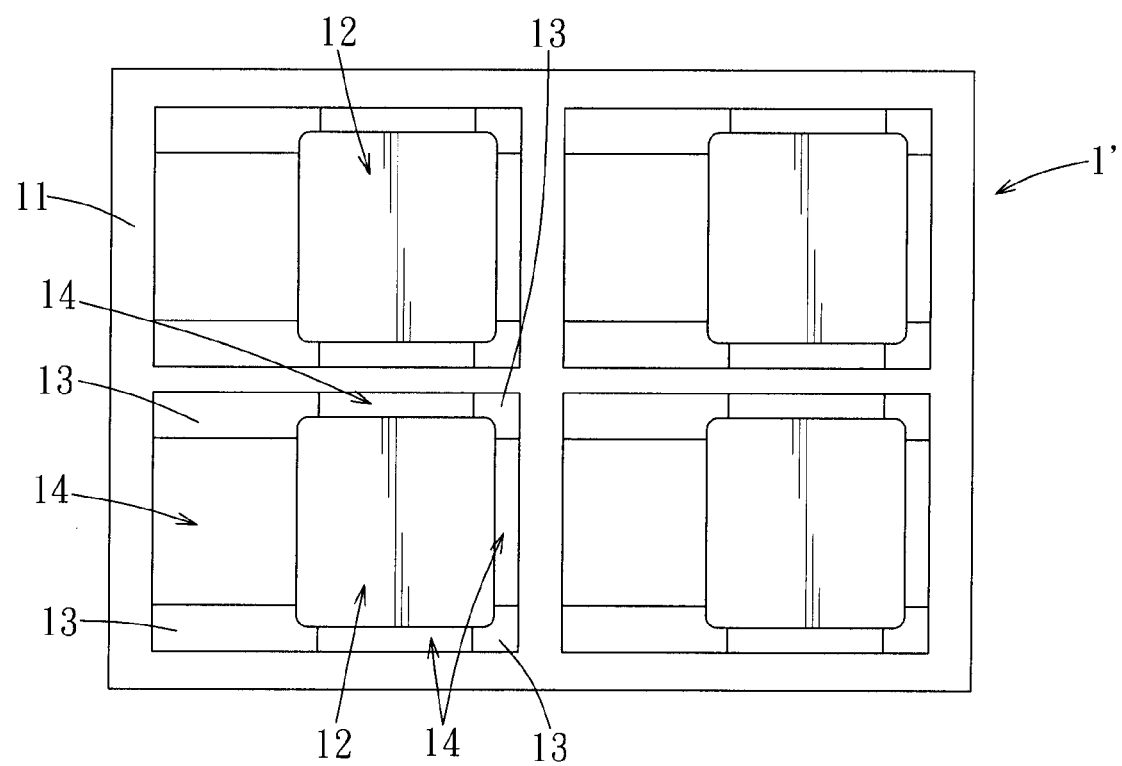
FIG. 7 is a top view of the cut rigid circuit board member of the first preferred embodiment of a rigid-flex printed circuit board module according to the present invention, illustrating first board bodies connected to a first frame body through connecting portions.
Figures 8, 9:
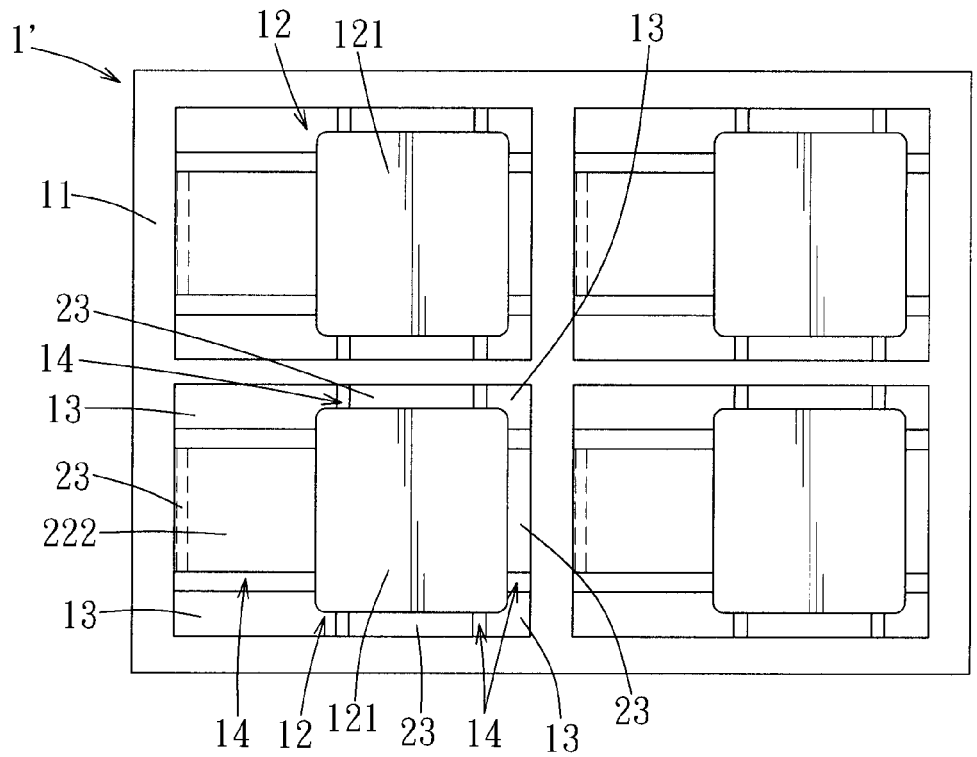
FIG. 8 is another top view of the first preferred embodiment of a rigid-flex printed circuit board module according to the present invention, illustrating the rigid circuit board members having the connecting portions bonded to the flexible circuit board member in a stack, and the interconnecting zones corresponding respectively to cutout portions in the rigid circuit board members.
FIG. 9 is a flowchart to illustrate a method for processing the first preferred embodiment of a rigid-flex printed circuit board module according to the present invention.

As shown in FIGS. 5, 6 and 8, in step 92, the rigid circuit board members 1' and the flexible circuit board member 2 thus cut are bonded together in a stack. In this embodiment, the two rigid circuit board members 1' are respectively bonded to top and bottom sides of the flexible circuit board member 2 in a stack such that the first frame bodies 11 are overlapped with and are bonded to the second frame body 21, and the first board bodies 12 are overlapped with and are bonded to the contact portions 221 of the second board bodies 22. The connecting portions 13 are not overlapped with the second board bodies 22, and at least a part of the interconnecting zones 23 is not overlapped with any of the connecting portions 13 and the first board bodies 12.

In this embodiment, each adjacent pair of the connecting portions 13 of each of the rigid circuit board members 1' is formed with a cutout portion 14, and each of the cutout portions 14 corresponds to a respective one of the interconnecting zones 23 of the flexible circuit board member 2 in position. The size of each of the first board bodies 12 corresponds to that of the contact portion 221 of each of the second board bodies 22. Therefore, after the rigid circuit board members 1' and the flexible circuit board member 2 are arranged in a stack, each of the interconnecting zones 23 corresponds to a respective one of the cutout portions 14 in position, and is not overlapped with any of the connecting portions 13 and the first board bodies 12.

Furthermore, since the interconnecting zones 23 correspond respectively to the cutout portions 14 in position and are not overlapped with the connecting portions 13 and the first board bodies 12, and since the extension portion 222 and the interconnecting zone 23 associated therewith of each of the second board bodies 22 correspond to the respective one of the cutout portions 14 in position, the connecting portions 13 of each of the first board bodies 12 are not overlapped with the corresponding second board body 22. It should be noted that, although the manufacturing method is exemplified in this embodiment to include two cut rigid circuit board members 1' that are disposed on the top and bottom sides of the flexible circuit board member 2, in practice, the rigid circuit board members 1' may be one or more than two in number, and the manner of stacking the rigid and flexible circuit board members 1', 2 may be varied. For example, a plurality of the cut rigid circuit board members 1' may be stacked together before the flexible circuit board member 2 is disposed on a top or bottom one of the stacked rigid circuit board members 1' or between an adjacent pair of the stacked rigid circuit board members 1' such that the contact portions 221 of the second board bodies 22 of the flexible circuit board member 2 can be respectively disposed on top or bottom sides of the first board bodies 12 of the top or bottom one of the stacked rigid circuit board members 1', or between the first board bodies 12 of an adjacent pair of the stacked rigid circuit board members 1'. Moreover, the contact portions 221 of the second board bodies 22 may not necessarily be the same as the first board bodies 12 in area, and may be smaller in area than the first board bodies 12 so that part of each of the first board bodies 12 is electrically conducted to the respective contact portion 221.

Subsequently, in step 93, a lathe (not shown) is used to cut off the connecting portions 13 interconnecting the first frame body 11 and each of the first board bodies 12 of each of the rigid circuit board members 1' so as to separate the first board bodies 12 from the respective first frame body 11, as shown in FIG. 1, thus completing the manufacture of the rigid-flex printed circuit board module 100.

It should be noted that, in step 91, although each of the cut rigid circuit board members 1' is formed with four connecting portions 13 connected to the four corners of each of the first board bodies 12, the connecting portions 13 may be two or three in number and are not limited to four as disclosed in this embodiment as long as the first board bodies 12 can be connected securely to the first frame body 11. Moreover, in step 92, at least a part of the interconnecting zones 23 of each of the second board bodies 22 may be designed to be overlapped with the connecting portions 13 or the first board body/bodies 12 corresponding thereto, i.e., the interconnecting zones 23 are partly overlapped with the connecting portions 13 and partly correspond to the cutout portions 14 in position. If the area of each first board body 12 is larger than that of the contact portion 221 of the second board body 22, the interconnecting zones 23 will be partly overlapped with the first board bodies 12 and will partly correspond to the cutout portions 14 in position.

Figure 10:
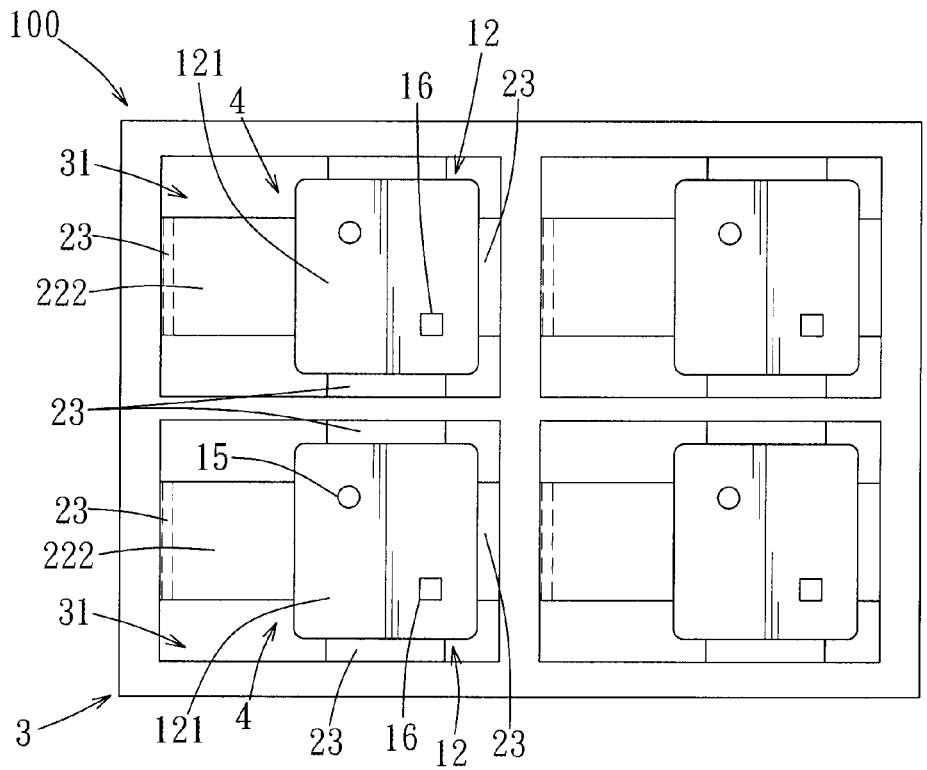
FIG. 10 is still another top view of the first preferred embodiment of a rigid-flex printed circuit board module according to the present invention with electronic components disposed on each of the first board bodies.

Referring to FIGS. 9 and 10, when the rigid-flex printed circuit board module 100 (as shown in FIG. 1) thus made is delivered to a system assembly plant, subsequent processing operations can be conducted according to requirements. A method for processing the rigid-flex printed circuit board module 100 according to the present invention includes the following steps.

In step 94, the rigid-flex printed board module 100 is fed to an automated assembly line (not shown) and is conveyed on a conveyor belt or track to various work stations along the assembly line, where various types of electronic components 15, 16 are mounted on the surface 121 of the first board body 12 or on the extension portion 222 of the second board body 22 in each working zone 4. The mounting of the electronic components 15, 16 may be realized using surface mounting technology (SMT), insertion or any other conventional technologies. Moreover, the number of the electronic components 15, to be mounted can vary depending on actual requirements.

Figure 11:
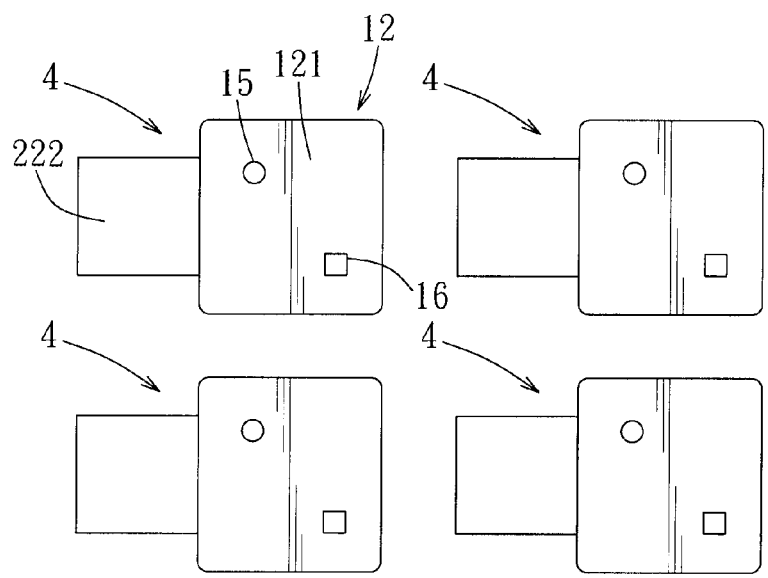
FIG. 11 is a top view of the first preferred embodiment of a rigid-flex printed circuit board module according to the present invention after the working zones are separated from the non-working zone.

In step 95, after completion of mounting of the electronic components 15, 16 in each working zone 4 of the rigid-flex printed circuit board module 100, a punch press (not shown) is used to cut off each interconnecting zone 23 so that each working zone 4 is separated from the non-working zone 3, as shown in FIG. 11. Subsequent assembly of the working zones 4 into electronic products can thus proceed. Certainly, cutting tools other than a punch press may also be used to perform the operation of cutting off the interconnecting zones 23.

In view of the current trend toward designing lighter and more compact electronic products, and due to use of an increasing number of rigid-flex printed circuit boards in electronic products, how to effectively reduce the costs associated with the manufacture and processing of the rigid-flex printed circuit board module 100 while effectively increasing the speed of separating the working zones 4 from the non-working zone 3 in the rigid-flex printed circuit board module 100 are important subjects of endeavor in the industry. In this embodiment, since the working zones 4 and the non-working zone 3 in the rigid-flex printed circuit board module 100 are interconnected through the interconnecting zones 23, and since the interconnecting zones 23 are defined by the flexible circuit board member 2, the interconnecting zones 23 are of the same thickness and material. Thus, when performing the operation of cutting off the interconnecting zones 23 of the rigid-flex printed circuit board module 100, the interconnecting zones 23 can be quickly cut off using a single machine (such as the punch press in this embodiment). Consequently, the speed of separating the working zones 4 from the non-working zone 3 is effectively increased to thereby reduce the costs and time associated with the manufacture and processing of the rigid-flex printed circuit board module 100. In addition, the flow during the manufacturing process can be simplified and the product quality of the working zones 4 after cutting can be ensured.

Figure 12:
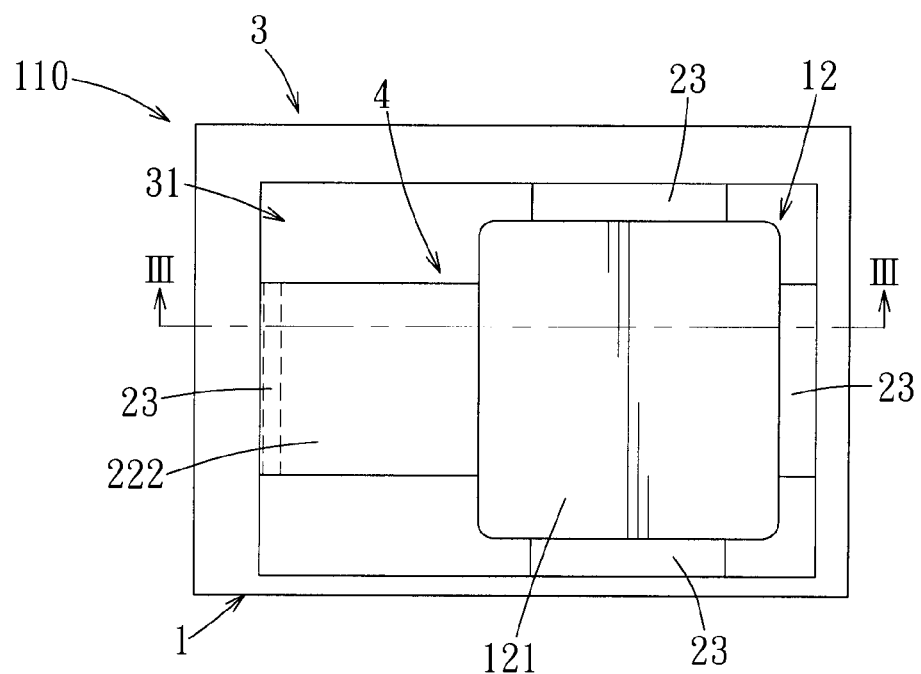
FIG. 12 is a top view of the second preferred embodiment of a rigid-flex printed circuit board module according to the present invention, illustrating a working zone connected to a non-working zone through interconnecting zones.
Figure 13:
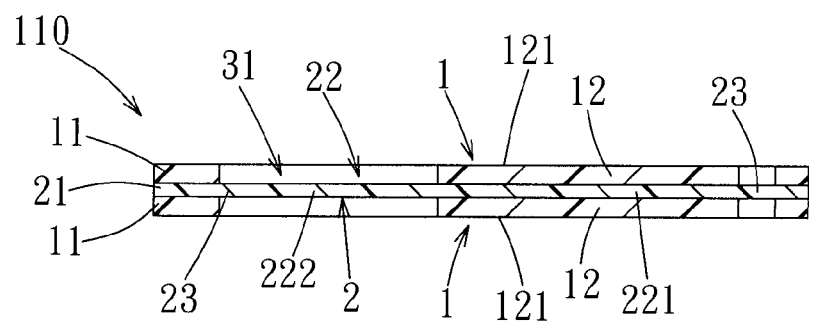
FIG. 13 is a sectional view of the second preferred embodiment taken along line III-III of FIG. 12.

Referring to FIGS. 12 and 13, the methods for manufacturing and processing the second embodiment of a rigid-flex printed circuit board module 110 according to the present invention are substantially the same as those for the first preferred embodiment. This embodiment is slightly different from the first preferred embodiment in structure. Specifically, the rigid-flex printed circuit board module 110 of this embodiment can be regarded as a single unit structure, which is about one-fourth of the rigid-flex printed circuit board module 100 having four interconnected printed circuit board units (see FIG. 1).

Figure 15:
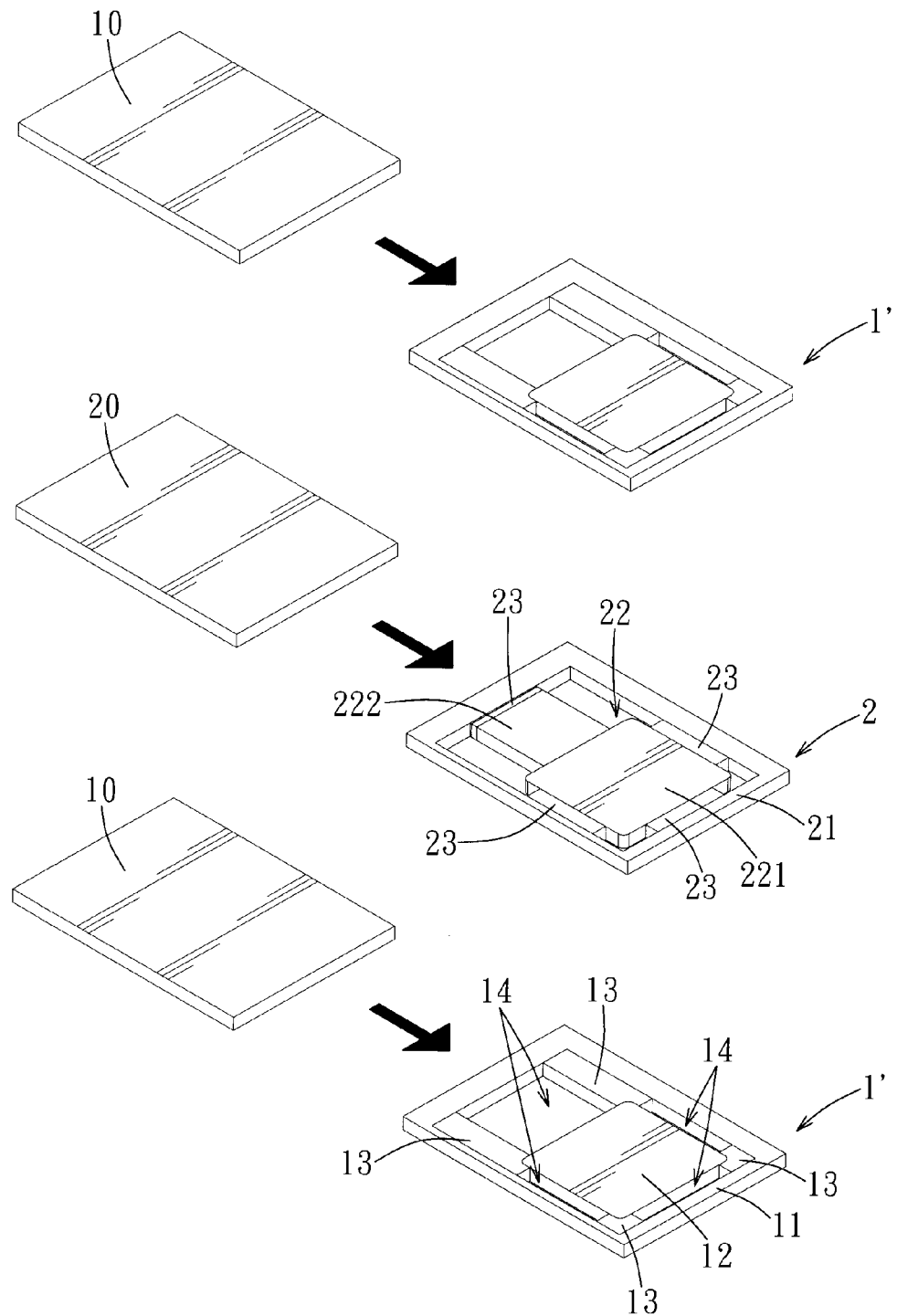
FIG. 15 is a schematic view to illustrate the manufacture of the second preferred embodiment of a rigid-flex printed circuit board module according to the present invention, showing the shapes of two rigid circuit board members and a flexible circuit board member respectively cut from rigid and flexible circuit board panels.
Figure 16:
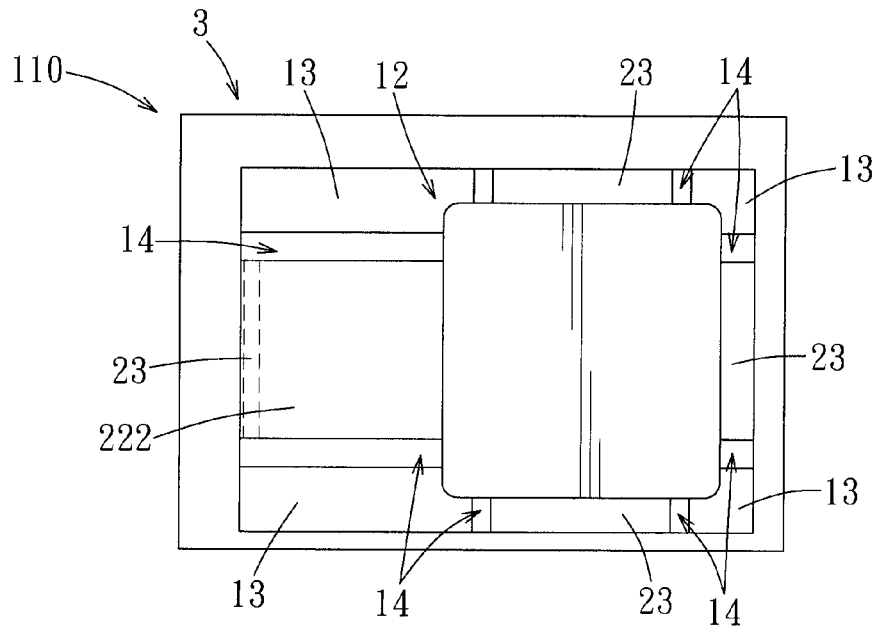
FIG. 16 is another top view of the second preferred embodiment of a rigid-flex printed circuit board module according to the present invention, illustrating the rigid circuit board members and the flexible circuit board member bonded together in a stack, and the interconnecting zones correspond- ing respectively to cutout portions in the rigid circuit board members.

Referring to FIGS. 14, 15, and 16, the method for manufacturing the rigid-flex printed circuit board module 110 according to the present invention comprises the following steps.

In step 91', two rigid circuit board panels 10' are respectively cut into two rigid circuit board members 1' such that each of the rigid circuit board members 1' has a first frame body 11 and a first board body 12 connected to the first frame body 11 through a plurality of connecting portions 13, and a flexible circuit board panel 20 is cut into a flexible circuit board member 2 such that the flexible circuit board member 2 has a second frame body 21 and a second board body 22 connected to the second frame body 21 through a plurality of interconnecting zones 23.

In step 92', the two rigid circuit board members 1' and the flexible circuit board member 2 thus cut are bonded together in a stack such that the first frame bodies 11 are overlapped with and are bonded to the second frame body 21, and the first board bodies 12 are overlapped with and are bonded to the contact portion 221 of the second board body 22. The connecting portions 13 are not overlapped with the second board body 22, and at least a part of the interconnecting zones 23 is not overlapped with any of the connecting portions 13 and the first board bodies 12. In this embodiment, each adjacent pair of the connecting portions 13 of each of the rigid circuit board members 1' is formed with a cutout portion 14, and each of the cutout portions 14 corresponds to a respective one of the interconnecting zones 23 of the flexible circuit board member 2 in position. In addition, the size of the first board body 12 of each of the rigid circuit board members 1' is substantially the same as that of the contact portion 221 of the second board body 22. Therefore, after the cut rigid circuit board members 1' and the flexible circuit board member 2 are arranged in a stack, each of the interconnecting zones 23 corresponds to a respective one of the cutout portions 14 in position, and is not overlapped with any of the connecting portions 13 and the first board bodies 12. Furthermore, since the interconnecting zones 23 correspond respectively to the cutout portions 14 in position and are not overlapped with the connecting portions 13 and the first board bodies 12, and since the extension portion 222 and the interconnecting zone 23 associated therewith of the second board body 22 correspond to the respective one of the cutout portions 14 in position, the connecting portions 13 of each of the first board bodies 12 are not overlapped with the second board body 22.

In step 93', a lathe is used to cutoff the connecting portions 13 interconnecting the first frame body 11 and the first board body 12 of each of the rigid circuit board members 1' so as to separate the first board bodies 12 from the respective first frame bodies 11, as shown in FIG. 13, thus completing the manufacture of the rigid-flex printed circuit board module 100.

Figure 17:
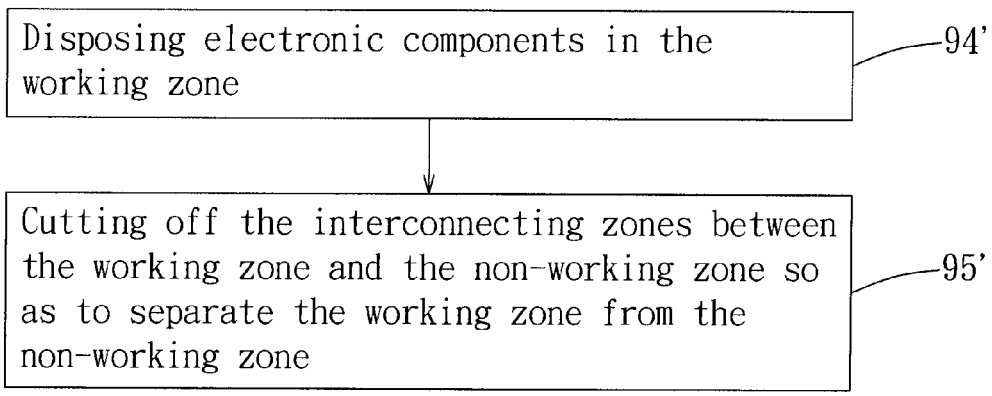
FIG. 17 is a flowchart to illustrate a method for processing the second preferred embodiment of a rigid-flex printed cir- cuit board module according to the present invention.
Figure 18:
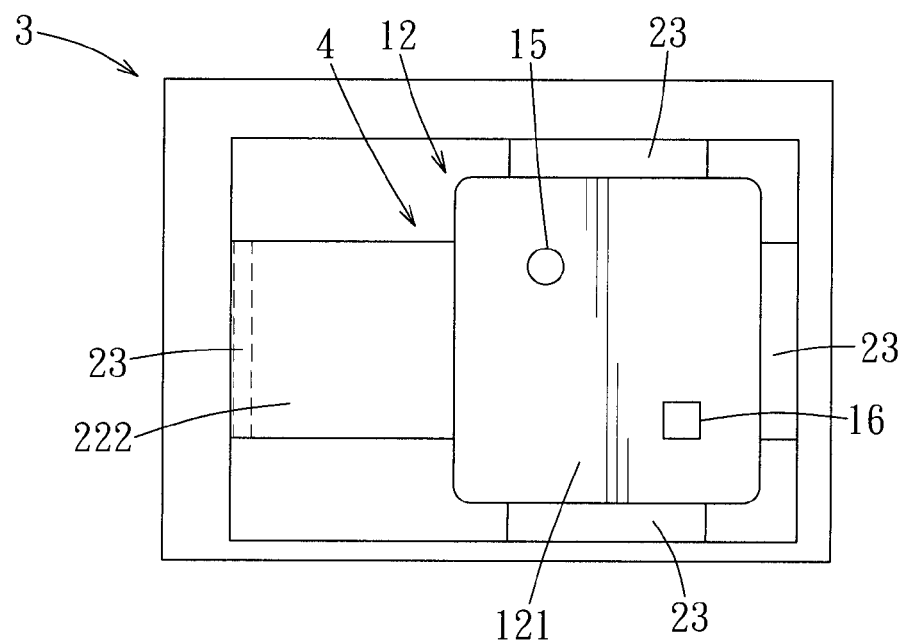
FIG. 18 is a top view of the second preferred embodiment of a rigid-flex printed circuit board module according to the present invention with electronic components disposed on the first board body.

Referring to FIGS. 17 and 18, the method for processing the rigid-flex printed circuit board module 110 according to the present invention comprises the following steps.

In step 94', the rigid-flex printed circuit board module 110 is fed to an automated assembly line (not shown) and is conveyed on a conveyor belt or track to various work stations along the assembly line, where various types of electronic components 15, 16 are mounted on the surfaces 121 of the first board bodies 12 of the rigid circuit board members 1' or on the extension portion 222 of the second board body 22 in the working zone 4.

Figure 19:
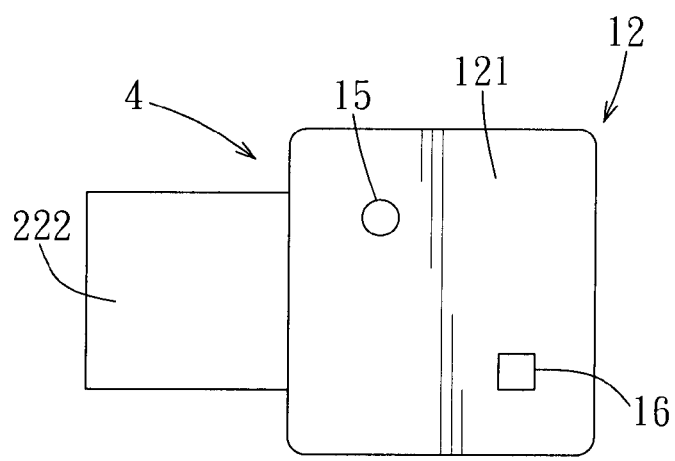
FIG. 19 is a top view of the second preferred embodiment of a rigid-flex printed circuit board module according to the present invention after the working zone is separated from the non-working zone.

In step 95', a punch press is used to cut off each interconnecting zone 23 so that the working zone 4 is separated from the non-working zone 3 as shown in FIG. 19. Subsequent assembly of the working zone 4 into an electronic product can thus proceed.

In summary, in the above-described embodiments of the rigid-flex printed circuit board module 100, 110 according to the present invention, since the working zone(s) 4 and the non-working zone 3 are interconnected through the flexible interconnecting zones 23, when cutting off the interconnecting zones 23 of the rigid-flex printed circuit board module 100, 110, the interconnecting zones 23 can be quickly cut off using a single machine. Thus, the speed of separating the working zones 4 from the non-working zone 3 is effectively increased to thereby reduce costs and time associated with the manufacture and processing of the rigid-flex printed circuit board module 100, 110. In addition, the processing flow can be simplified, and the product quality of the working zones 4 after cutting can be ensured.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A rigid-flex printed circuit board module comprising:
   a non-working zone defining a receiving space;
   a working zone disposed in said receiving space and connected to said non-working zone through a plurality of interconnecting zones, each of said interconnecting zones being a flexible region that has greater flexibility than said non-working zone;
   a rigid circuit board member including a first frame body; and
   a flexible circuit board member including a second frame body;
   wherein said first and second frame bodies are bonded together in a stack and cooperatively define said non-working zone.

2. The rigid-flex printed circuit board module of claim 1, wherein said interconnecting zones are of the same thickness and material.

3. The rigid-flex printed circuit board module of claim 2, wherein said flexible circuit board member defines said interconnecting zones.

4. The rigid-flex printed circuit board module of claim 1, wherein said flexible circuit board member defines said interconnecting zones.

5. The rigid-flex printed circuit board module of claim 1, wherein said rigid circuit board member further includes a first board body, said flexible circuit board member further including a second board body, said first and second board bodies being bonded together in a stack and cooperatively defining said working zone.

6. The rigid-flex printed circuit board module of claim 5, wherein said first frame body surrounds said first board body and is separated from said first board body, and said second frame body surrounds said second board body, said flexible circuit board member defines said interconnecting zones, which interconnect said second board body and said second frame body.

7. The rigid-flex printed circuit board module of claim 2, wherein said rigid circuit board member further includes a first board body, said flexible circuit board member further including a second board body, said first board body and said second board body being bonded to each other in a stack and cooperatively defining said working zone.

8. The rigid-flex printed circuit board module of claim 7, wherein said first frame body surrounds said first board body and is separated from said first board body, and said second frame body surrounds said second board body, said flexible circuit board member defining said interconnecting zones, which interconnect said second board body and said second frame body.

9. A rigid-flex printed circuit board module comprising:
a non-working zone defining two receiving spaces that are adjacent to each other;
two working zones, each of which is disposed in a respective one of said receiving spaces and is connected to said non-working zone through a plurality of interconnecting zones, each of said interconnecting zones being a flexible region that has greater flexibility than said non-working zone;
a rigid circuit board member including a first frame body; and
a flexible circuit board member including a second frame body;
wherein said first and second frame bodies are bonded to each other in a stack and cooperatively define said non-working zone.

10. The rigid-flex printed circuit board module of claim 9, wherein said interconnecting zones are of the same thickness and material.

11. The rigid-flex printed circuit board module of claim 10, wherein said flexible circuit board member defining defines said interconnecting zones.

12. The rigid-flex printed circuit board module of claim 9, wherein said flexible circuit board member defines said interconnecting zones.

13. The rigid-flex printed circuit board module of claim 9, wherein said rigid circuit board member further includes two first board bodies, said first frame body surrounding and being separated from each of said first board bodies, said flexible circuit board member further including two second board bodies, said second frame body surrounding each of said second board bodies, each of said first board bodies and a respective one of said second board bodies being bonded together in a stack and cooperatively defining a respective one of said working zones, said flexible circuit board member defining said interconnecting zones, which interconnect said second board bodies and said second frame body.

14. The rigid-flex printed circuit board module of claim 10, wherein said rigid circuit board member further includes two first board bodies, said first frame body surrounding and being separated from each of said first board bodies, said flexible circuit board member further including two second board bodies, said second frame body surrounding each of said second board bodies, each of said first board bodies and a respective one of said second board bodies being bonded together in a stack and cooperatively defining a respective one of said working zones, said flexible circuit board member defining said interconnecting zones, which interconnect said second board bodies and said second frame body.

15. A method for manufacturing a rigid-flex printed circuit board module adapted for use on a rigid circuit board panel and a flexible circuit board panel, said method comprising:

(A) cutting the rigid circuit board panel into a rigid circuit board member such that the rigid circuit board member has a first frame body and a first board body connected to the first frame body through a plurality of connecting portions, and cutting the flexible circuit board panel into a flexible circuit board member such that the flexible circuit board member has a second frame body and a second board body connected to the second frame body through a plurality of interconnecting zones;

(B) bonding the rigid circuit board member and the flexible circuit board member together such that the first frame body and the second frame body are bonded to each other in a stack, and the first board body and the second board body are bonded to each other in a stack, the connecting portions being not overlapped with the second board body, at least apart of the interconnecting zones being not overlapped with the connecting portions and the first board body; and (C) cutting off the connecting portions so as to separate the first board body from the first frame body.

16. The method for manufacturing a rigid-flex printed circuit board module of claim 15, wherein, in step (A), the rigid circuit board member further has a plurality of cutout portions corresponding respectively to the interconnecting zones in position, and in step (B), the interconnecting zones correspond respectively to the cutout portions in position and are not overlapped with the connecting portions and the first frame body.

17. A method for manufacturing a rigid-flex printed circuit board module adapted for use on a rigid circuit board panel and a flexible circuit board panel, said method comprising:

(A) cutting the rigid circuit board panel into a rigid circuit board member such that the rigid circuit board member has a first frame body and at least two first board bodies each of which is connected to the first frame body through a plurality of connecting portions, and cutting the flexible circuit board panel into a flexible circuit board member such that the flexible circuit board member has a second frame body and at least two second board bodies each of which is connected to the second frame body through a plurality of interconnecting zones;

(B) bonding the rigid circuit board member and the flexible circuit board member together such that the first frame body and the second frame body are bonded to each other in a stack, and each of the first board bodies is bonded to a corresponding one of the second board bodies in a stack, the connecting portions being not overlapped with the second board bodies, at least apart of the interconnecting zones being not overlapped with the connecting portions and the first board bodies; and (C) cutting off the connecting portions connecting each of the first board bodies to the first frame body so as to separate the first board bodies from the first frame body.

18. The method for manufacturing a rigid-flex printed circuit board module of claim 17, wherein, in step (A), the rigid circuit board member further has a plurality of cutout portions corresponding respectively to the interconnecting zones in position, and in step (B), the interconnecting zones correspond respectively to the cutout portions in position and are not overlapped with the connecting portions and the first frame body.

* * * * *